United States Patent [19]
Kosai et al.

[11] Patent Number: 5,559,336
[45] Date of Patent: Sep. 24, 1996

[54] INTEGRATED LPE-GROWN STRUCTURE FOR SIMULTANEOUS DETECTION OF INFRARED RADIATION IN TWO BANDS

[75] Inventors: Kenneth Kosai; Jerry A. Wilson; Bonnie A. Baumgratz, all of Goleta, Calif.

[73] Assignee: Santa Barbara Research Center, Goleta, Calif.

[21] Appl. No.: 270,965

[22] Filed: Jul. 5, 1994

[51] Int. Cl.$^6$ ............................................. H01L 31/0296
[52] U.S. Cl. ............................. 250/370.13; 250/338.4; 250/339.02; 250/370.12; 257/188; 257/442
[58] Field of Search ...................... 250/370.13, 370.12, 250/339.02, 338.4; 257/624, 466, 442 188

[56] References Cited

U.S. PATENT DOCUMENTS

| | | | |
|---|---|---|---|
| 4,753,684 | 6/1988 | Ondris et al. | 136/258 |
| 4,811,080 | 3/1989 | Richards | 257/624 |
| 4,847,489 | 7/1989 | Dietrich | 250/226 |
| 5,113,076 | 5/1992 | Schulte | 250/370.06 |
| 5,149,956 | 9/1992 | Norton | 250/211 J |
| 5,373,182 | 12/1994 | Norton | 257/440 |

FOREIGN PATENT DOCUMENTS

| | | |
|---|---|---|
| 54-10210 | 8/1980 | Japan. |
| 2255227A | 4/1991 | United Kingdom. |

OTHER PUBLICATIONS

Woodall et al., "Differential Phototransducer", IBM Technical Disclosure Bulletin, vol. 12, No. 9, Feb. 1970, pp. 1486.

Pawlikowski et al., "Some Properties of Photovoltaic Cdx-Hg1-xTe Detectors for Infrared Radiation" Institute of Physics, Technical University, Jan. 8, 1978, pp. 331–337.

Tung, "Infinite–Melt Vertical Liquid–Phase Epitaxy of HgCdTe From Hg Solution: Status and Prospects", Journal of Crystal Growth 86 (1988)161–172.

Tung et al., "Liquid Phase Epitaxy of Hg1-xCdxTe From Hg Solution: A Route to Infrared Detection Structures", Materials for Infrared Detectors and Sources, Mater. Res. Soc. Symp. Proc., vol. 90, Eds. R F C Farrow, J. F. Schetzina, and J. T. Cheung (Mater. Res. Soc., Pittsburgh, PA.) pp. 1–36.

Arias et al., "HgCdTe Dual–Band Infrared Photodiodes Grown by Molecular Beam Epitaxy", J. Appl. Phys. 70 (8), 15, Oct. 1991, pp. 4620–4622.

*Primary Examiner*—Constantine Hannaher
*Attorney, Agent, or Firm*—W. C. Schubert; W. K. Denson-Low

[57] ABSTRACT

A radiation detector (1) unit cell (10) includes an n-p+ LWIR photodiode that is vertically integrated with a p+-n MWIR photodiode in a n-p+-n structure. Electrical contact is made separately to each of these layers in order to simultaneously detect both the LWIR and MWIR bands. The electrical contact is made via indium bump interconnections (23, 25, 27) enabling the unit cell to be subsequently hybridized with a topside mounted electronic readout integrated circuit (30). The n-p+-n structure in a given pixel of an array of radiation detector pixels is electrically isolated from all neighboring pixels by a trench (28) that is etched into an underlying substrate (12). To compensate for a reduction in the optically sensitive area due to the placement of the electrical contacts and the presence of the pixel isolation trench, a microlens (34) may be provided within, upon, or adjacent to the backside, radiation receiving surface of the substrate in registration with the unit cell.

20 Claims, 2 Drawing Sheets

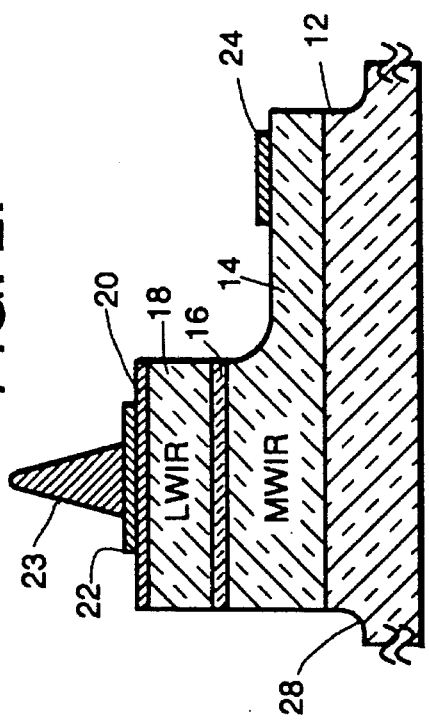
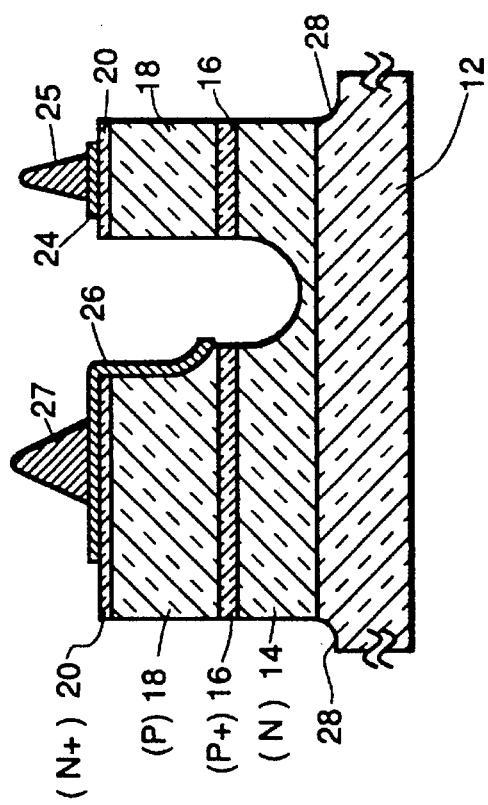
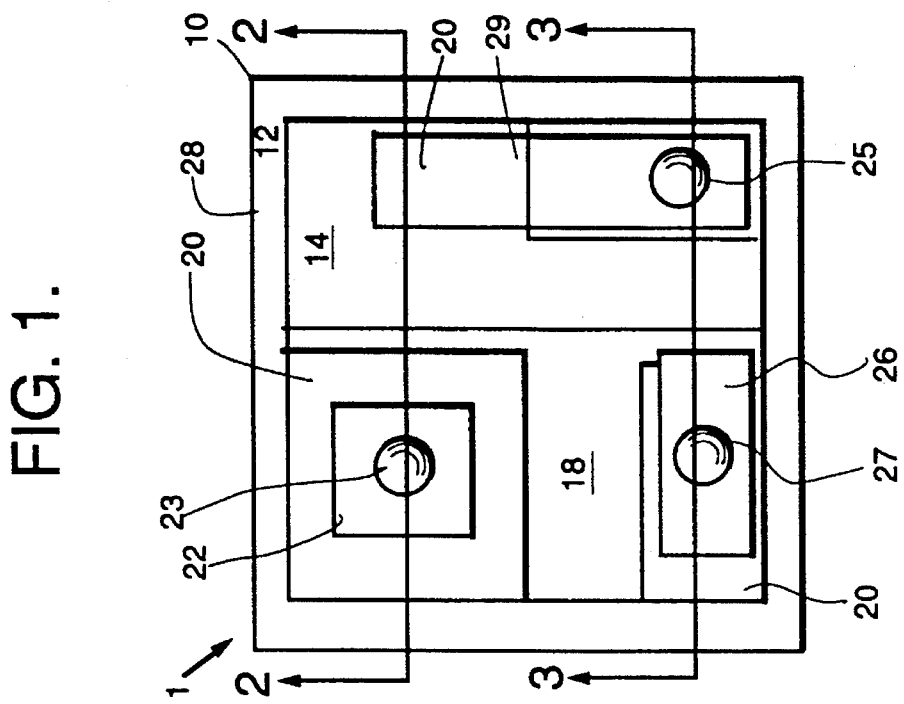

INTEGRATED LPE-GROWN STRUCTURE FOR SIMULTANEOUS DETECTION OF INFRARED RADIATION IN TWO BANDS

FIELD OF THE INVENTION

This invention pertains generally to radiation detectors and, in particular, to radiation detectors that are capable of detecting radiation within two wavelength bands.

BACKGROUND OF THE INVENTION

Bias-selected n-p$^+$-n mercury-cadmium-telluride (HgCdTe) detectors that are sensitive to infrared (IR) radiation within two spectral bands or "colors" have been fabricated using various combinations of molecular beam epitaxy (MBE) and liquid phase epitaxy (LPE). These detectors include those fabricated solely by MBE, those fabricated by the MBE growth of a long wavelength IR (LWIR) layer on top of an LPE grown mid-wavelength IR (MWIR) p$^+$-n double layer, and those fabricated using only LPE.

However, a structure grown using MBE typically exhibits a high leakage current and low $R_oA$. This is due to the immaturity of the MBE growth process relative to LPE.

Commonly assigned U.S. Pat. No. 5,113,076, "Two Terminal Multi-band Infrared Radiation Detector" to E. F. Schulte, discloses a radiation detector having two heterojunctions that function in a manner analogous to two back-to-back photodiodes. Each of the photodiodes is responsive to radiation within a different IR spectral band, such as LWIR and MWIR. Disclosed configurations include an n-p-n configuration, a p-n-p configuration, and a p-n-p-n configuration.

Reference in this regard is also made to a n-p+-n dual-band detector described by J. M. Arias et al. in the Journal of Applied Physics, 70(8), Oct. 15, 1991, pg. 4820–4822.

Commonly assigned U.S. Pat. No. 5,149,956, "Two-Color Radiation Detector Array and Methods of Fabricating Same", by P. R. Norton, teaches an array of three layer n-p-n or p-n-p photodetector structures in which a middle, electrically common layer is electrically and physically continuous across the array. The top and bottom layers are sensitive to different spectral bands, and each unit cell has two topside electrical contact structures, including indium bumps, for interfacing these layers to a readout circuit. A common contact provides a connection to the middle layer. A binary or analog lens array can be provided on or adjacent to the back, radiation receiving surface of the detector array to improve the fill factor. Due to the geometry of this device, the indium bumps are positioned at different levels.

In commonly assigned U.S. patent application Ser. No. 08/045,741, filed Apr. 8, 1993, "Dual-Band Infrared Radiation Detector Optimized for Fabrication In Compositionally Graded HgCdTe", now U.S. Pat. No. 5,457,331, K. Kosai and G. R. Chapman describe a four layer n-p$^+$-p-n$^+$ structure, grown by the well-characterized LPE process, that includes a substrate and, from a bottom layer next to the substrate to the surface: (a) a MWIR radiation responsive low-doped n-type absorbing layer; (b) a high-doped p-type (p$^+$) cap layer; (c) a LWIR radiation responsive low-doped p-type absorbing layer; and (d) a high-doped n-type (n$^+$) top layer. The high-doped n-type top layer has a compositional profile that is similar to the high-doped p-type cap layer.

For an application where it is desirable to obtain the simultaneous detection of radiation in two spectral bands, and to also employ a topside readout integrated circuit, electrical contact must be made separately to the MWIR radiation responsive n-type layer, the LWIR radiation responsive p-type layer, and to the n$^+$ top (capping) layer. Alternatively, the structure may be fabricated as a n-p+-n structure and electrical contact made to all three layers. The electrical contact is preferably made via indium bump interconnections so that the detector unit cell can be subsequently hybridized with the electronic readout integrated circuit.

For this case a problem is presented in that the three indium bump interconnects must be provided within the limited area (for example, 50 microns square) of the unit cell. Furthermore, it is desirable to electrically isolate the individual unit cells of the array from one another. Satisfying both of these requirements can result in a decrease in the active optical area, with a corresponding reduction in sensitivity. A further desirable goal is to provide the top-most point of each indium bump at approximately the same height, relative to the underlying unit cell, so as to facilitate the interconnection of the unit cell to a readout integrated circuit.

OBJECTS OF THE INVENTION

It is therefore one object of this invention to provide a backside illuminated three terminal per unit cell radiation detector that operates to simultaneously detect radiation within two spectral bands, wherein each of the three terminals is accessible, within the confines of the area of the unit cell, to a topside mounted readout device using indium bumps positioned at the same vertical level.

It is another object of this invention to provide a three terminal per unit cell radiation detector that operates to simultaneously detect radiation within two spectral bands, and that includes a microlens that is provided within, upon, or adjacent to a backside, radiation receiving surface of the unit cell. The microlens collects radiation incident on a unit-cell sized area and concentrates it to the active region of the detector.

It is a further object of this invention to provide a three terminal per unit cell radiation detector that operates to simultaneously detect radiation within two spectral bands, and that is grown by LPE as a three layer n-p$^+$-n or a four layer n-p$^+$-p-n$^+$ structure that includes compositionally graded Group II-VI semiconductor material, in accordance with the teachings of Kosai and Chapman in the above-referenced U.S. patent application Ser. No. 08/045,741.

SUMMARY OF THE INVENTION

The foregoing and other problems are overcome and the objects of the invention are realized by a dual-band infrared detector that is constructed in accordance with this invention. In a presently preferred embodiment of the invention a radiation detector pixel unit cell includes an n-p+ LWIR photodiode that is vertically integrated with a p+-n MWIR detector in a n-p+-n structure. Electrical contact is made separately to each of these layers in order to simultaneously detect both the LWIR and MWIR bands. The electrical contact is made via indium bump interconnections so that the detector unit cell can be subsequently hybridized with a topside mounted electronic readout integrated circuit. The n-p$^+$-n structure in a given pixel of an array of radiation detector pixels is electrically isolated from all neighboring pixels by a trench that is etched into an underlying substrate.

To compensate for a reduction in the optically sensitive area due to the placement of the electrical contacts and the presence of the pixel isolation trench, a microlens may be provided within, upon, or adjacent to the backside, radiation receiving surface of the unit cell. This increases the effective fill factor (the ratio of optically active area to the total area of the unit cell) by focusing incident infrared radiation onto the reduced optically active area within the pixel unit cell.

The practice of this invention thus enables the fabrication of two-color imaging arrays with high fill factors. As an example, in a 50×50 µm unit cell, the maximum optically active area is approximately 25×25 µm, which is a fill factor of 25 percent. The use of the microlens can increase the effective fill factor to greater than 80 percent.

BRIEF DESCRIPTION OF THE DRAWINGS

The above set forth and other features of the invention are made more apparent in the ensuing Detailed Description of the Invention when read in conjunction with the attached Drawings, wherein:

FIG. 1 is top, enlarged view of a single unit cell of a two-color infrared radiation detector that is constructed in accordance with this invention;

FIG. 2 is a cross-sectional view (not to scale) of the unit cell of FIG. 1, taken along the section line 2—2;

FIG. 3 is a cross-sectional view (not to scale) of the unit cell of FIG. 1, taken along the section line 3—3;

DETAILED DESCRIPTION OF THE INVENTION

Figure 5:
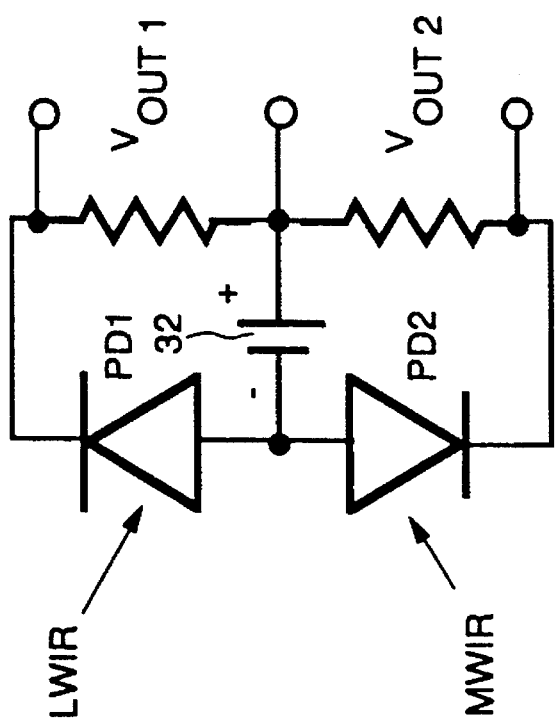
FIG. 5 is a simplified schematic diagram that illustrates a single two-color detector that is coupled to a bias source within the readout integrated circuit of FIG. 4 for simultaneously reading out MWIR and LWIR generated photocurrents.

Reference is first made to FIGS. 1, 2 and 3 for showing a top view and cross-sectional views, not to scale, of an embodiment of a two-color or dual-band (MWIR and LWIR) radiation detector 1 that is constructed in accordance with this invention. The detector 1 is contained within the confines of a unit cell 10 and includes an electrically insulating and optically transparent (at the wavelengths of interest) substrate 12 over which is grown, by LPE, a multi-layered Group II-VI (HgCdTe) radiation detector structure. One suitable material for the substrate is CdZnTe. A suitable thickness for the CdZnTe substrate is approximately 0.5 millimeter. An antireflection coating (not shown) may be applied to the bottom, radiation receiving surface of the substrate 12.

As an example, the unit cell 10 has dimensions of 50 micrometers by 50 micrometers. In practice, the substrate 12 is common to a plurality of such unit cells which are fabricated as a linear or as a two-dimensional array to form a dual-band imaging detector.

Suitable LPE growth techniques for fabricating the detector 1 are described in, by example, the following two articles: T. Tung, M. H. Kalisher, A. P. Stevens and P. E. Herning, in: Materials for Infrared Detectors and Sources, Mater. Res. Soc. Symp. Proc., Vol. 90 (Mater. Res. Soc., Pittsburgh, Pa., 1987), p.321; and T. Tung, Infinite-Melt Vertical Liquid-Phase Epitaxy of HgCdTe from Hg Solution: Status and Prospects, J. Crystal Growth 86 (1988), pg. 161–172.

As employed herein Short Wavelength Infrared (SWIR) radiation is considered to include a spectral region extending from approximately 1000 nanometers (nm) to approximately 3000 nm. Medium Wavelength Infrared (MWIR) radiation is considered to include a spectral region extending from approximately 3000 nm to approximately 8000 nm. Long Wavelength Infrared (LWIR) radiation is considered to include a spectral region extending from approximately 7000 nm to approximately 14000 nm. Very Long Wavelength Infrared (VLWIR) radiation is considered to include a spectral region extending from approximately 12000 nm to approximately 30000 nm. Although the bands overlap to some extent, for the purposes disclosed herein the overlap is not considered to be significant. Also, as employed herein a semiconductor material is considered to exhibit significant responsivity to a given spectral band if the semiconductor material exhibits a maximum or substantially maximum photosensitivity to wavelengths within the given spectral band.

In a presently preferred embodiment of this invention the LPE-grown multi-layered HgCdTe detector 1 is comprised of a first layer 14 (Layer 1) which is an n-type MWIR responsive radiation absorbing layer. Layer 1 has a thickness of approximately 10 to 15 micrometers and is lightly doped n-type with indium at a concentration of $3 \times 10^{15}$ atoms/cm$^3$. Overlying the first layer 14 is a second layer 16 (Layer 2) which is a p$^+$-type cap layer. Layer 2 has a thickness of approximately 2 micrometers and is heavily doped p-type with arsenic at a concentration in the range of $10^{17}$ to $10^{18}$ atoms/cm$^3$. Overlying the second layer 16 is a third layer 18 (Layer 3) which is a p-type LWIR responsive radiation absorbing layer. Layer 3 has a thickness of approximately 5 to 6 micrometers and is doped p-type with arsenic at a concentration of $3 \times 10^{15}$ atoms/cm$^3$. Overlying the third layer 18 is a top layer 20 (Layer 4) which is an n$^+$-type layer. Layer 4 has a thickness of approximately 2 micrometers and is doped n-type with indium at a concentration in the range of $10^{17}$ to $10^{18}$ atoms/cm$^3$.

In accordance with an aspect of this invention the four layers are differentiated by etching or milling into three mesa structures. The first, largest mesa structure (for example, 25 micrometers by 25 micrometers) supports a first electrical contact 22 and indium bump 23 which are electrically coupled to the fourth layer 20 and, hence, to the LWIR n$^+$-p junction that is contained within the first mesa structure. The second mesa structure supports a second electrical contact 24 and indium bump 25 which are electrically coupled to the first layer 14 and, hence, to the MWIR n-p$^+$ junction. The third mesa structure supports a third electrical contact 26 and indium bump 27 which are electrically coupled to the common third layer 18. All three indium bump interconnects are accessible from the topside of the detector unit cell 10.

Figure 4:
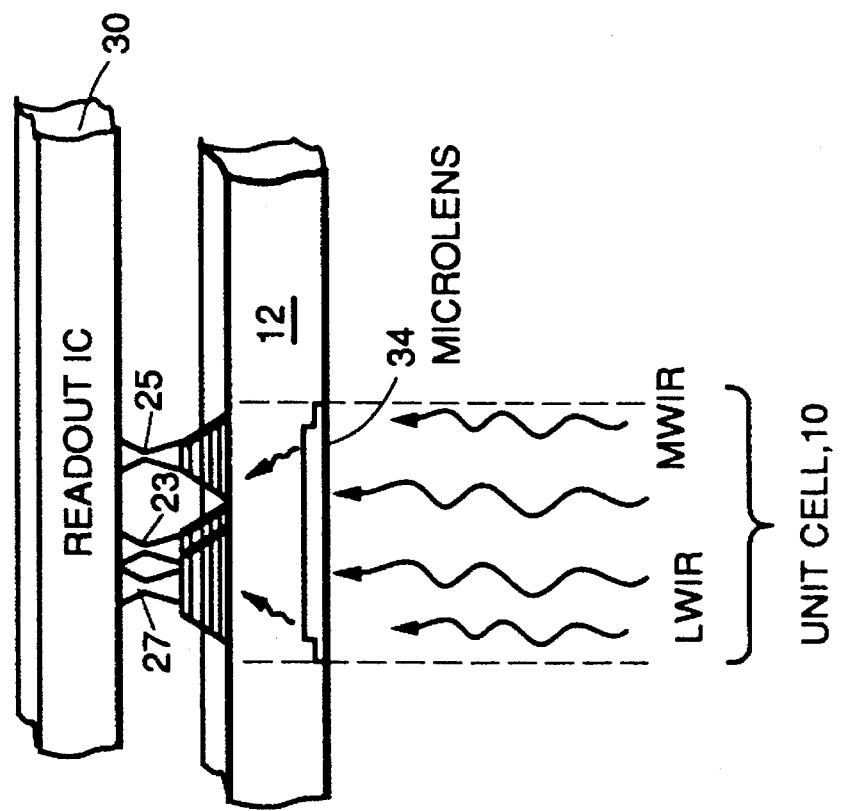
FIG. 4 is a cross-sectional view (not to scale) showing the unit cell of FIG. 1 coupled to a readout integrated circuit.

Furthermore, in that the top surfaces of each of the three mesa structures lie within the same horizontal plane, the top of each of the indium bumps are all at approximately the same height relative to this plane. This facilitates the connection of the unit cell 10 to a readout integrated circuit 30 (FIG. 4).

The contacts 24 and 26 are preferably formed as metal strips that run over the sides of their respective support mesas to electrically connect their associated indium bumps 25 and 27, respectively, to the required layers.

A trench 28 is formed into the CdZnTe substrate 12 so as to electrically isolate the unit cell 10 from other adjacent unit cells that are formed as a part of the linear or two-dimensional array of unit cells.

A suitable passivation coating (not shown), such as a layer of wide bandgap Group II-VI material, can be applied over all exposed surfaces of the mesa structures to reduce noise arising from surface states.

FIG. 5 is a schematic diagram that illustrates the n-p$^+$-p-n$^+$ detector 1 of FIGS. 1–3. When hybridized with the readout integrated circuit 30, as in FIG. 4, the indium bumps 23, 25 and 27 are coupled to a source of bias potential, illustrated as a battery 32. The LWIR photodiode is designated as PD1, and the MWIR photodiode is designated as PD2. In the illustrated configuration both PD1 and PD2 are slightly reverse biased with, for example, a 20 millivolt potential. This enables the simultaneous readout of photocurrent generated in response to both MWIR and LWIR radiation.

During the LPE growth of the four layered $Hg_{(1-x)}Cd_xTe$ structure the compositional profile (the value of x) is preferably varied through the thickness of the detector 1 in a controlled manner to provide a gradual reduction in bandgap energy from the Layer 1 to the Layer 4, and to also provide relatively higher bandgap energies within the Layers 2 and 4. The n$^+$ Layer 4 has a compositional profile that is similar to the p$^+$ Layer 2. Layers 1 and 2 form a p$^+$-n MWIR-responsive photodiode (PD2 of FIG. 5). On top of these two layers, the low doped (acceptor concentration of $<5\times10^{15}$ cm$^{-3}$), p-type Layer 3 is grown by LPE, followed by the highly doped (donor concentration $>10^{16}$ cm$^{-3}$) n$^+$ Layer 4. Layers 3 and 4, also grown by LPE, form a n$^+$-p LWIR-responsive photodiode (PD1 of FIG. 5).

In accordance with a method of this invention there is provided a process for fabricating a radiation detector structure, comprising a first step of providing a substrate followed by a second step of growing a first region comprised of Group II-VI semiconductor material upon a first surface of the substrate. The first region has a first type of electrical conductivity and has a bandgap selected for absorbing radiation within a first spectral band. The process then grows a second region upon the first region, the second region being comprised of Group II-VI semiconductor material that has a second type of electrical conductivity that is opposite the first type of electrical conductivity. A next step grows a third region upon the second region, the third region being comprised of Group II-VI semiconductor material that has the second type of electrical conductivity. The third region has a bandgap selected for absorbing radiation within a second spectral band. A next step grows a fourth region upon the third region, the fourth region being comprised of Group II-VI semiconductor material that has the first type of electrical conductivity.

A further step of the method differentiates the regions into at least three mesa structures, followed by a step of forming upon the at least three mesa structures three electrical contacts to the first, third and fourth layers. All three of the electrical contacts are formed so as to be accessible from a topside of the unit cell 10, and support indium bumps at the same level.

An optional next step provides a binary or an analog microlens 34 (FIG. 4) within, upon, or adjacent to a backside of the unit cell for focussing incident IR radiation into the structure, thereby increasing the effective fill factor. For example, the microlens 34 on the backside of the substrate 12 focuses the light from a 50×50 μm area onto the nominally 25×25 μm optically active area that comprises the main, LWIR-responsive mesa that is contacted through indium bump 23.

The microlens 34 compensates for the reduction in the optically sensitive area due to the presence of the mesa structures, electrical contacts, and the pixel isolation trench. The microlens 34 increases the effective fill factor (the ratio of optically active area to the total area of the unit cell) by focusing incident infrared radiation onto the reduced optically active area within the pixel unit cell 10.

The steps of growing the first, second, third and fourth regions are all accomplished, preferably, by Liquid Phase Epitaxy. Furthermore, for a case where the Group II-VI semiconductor material is comprised of $Hg_{(1-x)}Cd_xTe$, during the execution of the steps of growing x may be varied so as to provide a decreasing bandgap energy within the first region, to provide an increasing bandgap energy within the second region, to provide a decreasing bandgap energy with the third region, and to provide an increasing bandgap energy within the fourth region.

The detector structure of the invention thus beneficially employs compositionally graded $Hg_{(1-x)}Cd_xTe$ layers that are grown by LPE. Advantages of the resulting structure, as compared to a structure grown by MBE or by Metal-Organic Vapor-Phase Deposition (MOCVD), include a higher LWIR quantum efficiency and a thicker p-type layer 18. The thicker p-type layer 18 facilitates the fabrication of the electrical contact 26.

Although described in the context of a MWIR-LWIR radiation responsive device, it should be realized that the detector 1 can be constructed to be responsive to other combinations of wavelength bands, such as SWIR-MWIR, SWIR-LWIR, or MWIR-VLWIR. The arrangement of the radiation absorbing layers in these alternate embodiments is such that the incident radiation first encounters the wider bandgap semiconductor material. Furthermore, in these alternate embodiments the material of the substrate 12 is selected so as to be substantially transparent to the wavelength bands of interest. Also, the substrate 12 can be comprised of a material other than a Group II-VI material (CdZnTe). For example, the substrate 12 can be comprised of a Group IV material, such as Si, or a Group III-V material, such as GaAs.

Furthermore, the detector 1 can be fabricated as a three layer structure (n-p$^+$-n), and electrical contact made to each of the three layers as described above.

Thus, while the invention has been particularly shown and described with respect to a preferred embodiment thereof, it will be understood by those skilled in the art that changes in form and details may be made therein without departing from the scope and spirit of the invention.

What is claimed is:

1. A radiation detector unit cell that is responsive to electromagnetic radiation within two spectral bands, said radiation detector unit cell including a plurality of adjacently disposed layers of adjustable energy gap semiconductor material that are disposed upon a first surface of a transparent substrate, said substrate having a second surface opposite the first surface for admitting electromagnetic radiation to be detected, said detector unit cell comprising:

a first photodiode having an anode and a cathode, said first photodiode being responsive to electromagnetic radiation within a first spectral band for generating a detectable photocurrent in response thereto; and a second photodiode having an anode and a cathode, said second photodiode being responsive to electromagnetic radiation within a second spectral band for generating a detectable photocurrent in response thereto; wherein said first photodiode is electrically coupled in series with said second photodiode such that said anode of said first photodiode is coupled to said anode of said second photodiode; said unit cell further comprising a plurality of connection means individual ones of which are electrically coupled to said cathode of said first photodiode, to said cathode of said second photodiode, and to said anodes of said first and said second photodiodes;

a first mesa structure formed through a plurality of said adjacently disposed layers, a second mesa structure formed through a plurality of said adjacently disposed layers, and a third mesa structure formed through a plurality of said adjacently disposed layers, each of said mesa structures having a top surface that supports one of said plurality of connection means, and a trench that surrounds said unit cell, said trench extending through said plurality of adjacently disposed layers and into said substrate.

2. A radiation detector as as set forth in claim 1, wherein each of said connection means is comprised of a contact pad having an indium bump interconnect formed thereon.

3. A radiation detector unit cell as set forth in claim 2, wherein said top surface of each of said mesa structures lies within a common horizontal plane, and wherein a top of each of the indium bump interconnects is at approximately the same distance from the common plane.

4. A radiation detector unit cell as set forth in claim 1, wherein said semiconductor material is comprised of a Group II-VI alloy, wherein the first and second spectral bands are selected from the group consisting essentially of SWIR, MWIR, LWIR, and VLWIR, wherein said Group II-VI alloy is comprised of $Hg_{(1-x)}Cd_xTe$, and wherein x is varied through a thickness of said plurality of layers.

5. A radiation detector unit cell as set forth in claim 1, and further comprising a lens means that is disposed within, upon, or adjacent to said second surface of said substrate.

6. A backside illuminated radiation detector unit cell comprising a substrate having a first surface and a plurality of layers disposed upon said first surface, said plurality of layers comprising:

a first layer disposed over said first surface of said substrate, said first layer being comprised of a semiconductor material having a first type of electrical conductivity and having a bandgap selected for absorbing radiation within a first spectral band;

a second layer overlying said first layer, said second layer being comprised of a semiconductor material having a second type of electrical conductivity that is opposite the first type of electrical conductivity and forming a diode junction with said first layer;

a third layer overlying said second layer, said third layer being comprised of a semiconductor material having the second type of electrical conductivity and having a bandgap selected for absorbing radiation within a second spectral band;

a fourth layer overlying said third layer, said fourth layer being comprised of a semiconductor material having the first type of electrical conductivity and forming a diode junction with said third layer;

a plurality of mesa structures each containing a portion of each of said plurality of layers; and an electrical contact disposed upon a top surface of each of said mesa structures for electrically contacting said first, said third, and said fourth layers.

7. A backside illuminated radiation detector unit cell comprising a substrate having a first surface and a plurality of layers disposed upon said first surface, said plurality of layers comprising:

a first layer disposed over said first surface of said substrate, said first layer being comprised of Group II-VI semiconductor material, said first layer having a first type of electrical conductivity and having a bandgap selected for absorbing radiation within a first spectral band;

a second layer overlying said first layer, said second layer being comprised of Group II-VI semiconductor material, said second layer having a second type of electrical conductivity that is opposite the first type of electrical conductivity and forming a diode junction with said first layer;

a third layer overlying said second layer, said third layer being comprised of Group II-VI semiconductor material, said third layer having the second type of electrical conductivity and having a bandgap selected for absorbing radiation within a second spectral band;

a fourth layer overlying said third layer, said fourth layer being comprised of Group II-VI semiconductor material, said fourth layer having the first type of electrical conductivity and forming a diode junction with said third layer;

a plurality of mesa structures each containing a portion of each of said plurality of layers; and an electrical contact disposed upon a top surface of each of said mesa structures for electrically contacting said first, said third, and said fourth layers.

8. A radiation detector unit cell as set forth in claim 7, and further comprising:

a trench that surrounds said unit cell, said trench extending through said plurality of layers and into said substrate.

9. A radiation detector unit cell as set forth in claim 7, and further comprising:

lens means that is disposed within, upon, or adjacent to a second, radiation receiving surface of said substrate.

10. A radiation detector unit cell as set forth in claim 7, wherein said first and second spectral bands are selected from the group consisting essentially of SWIR, MWIR, LWIR, and VLWIR.

11. A radiation detector unit cell as set forth in claim 7, wherein said Group II-VI semiconductor material is comprised of $Hg_{(1-x)}Cd_xTe$, and wherein x is varied through a thickness of said plurality of layers so as to provide a decreasing bandgap energy within said first layer, to provide an increasing bandgap energy within said second layer, to provide a decreasing bandgap energy within said third layer, and to provide an increasing bandgap energy within said fourth layer.

12. A radiation detector unit cell as set forth in claim 7, wherein said first layer is n-type, wherein said second layer is $p^+$-type, wherein said third layer is p-type, and wherein said fourth layer is $n^+$-type.

13. A radiation detector unit cell as set forth in claim 7, wherein said substrate is selected from a material that is substantially transparent to electromagnetic radiation within said first and said second spectral bands.

14. A radiation detector unit cell as set forth in claim 7, wherein said electrical contact includes an indium bump, wherein a top surface of each of said plurality of mesa structures lies within a common horizontal plane, and wherein a top of each of the indium bumps is at approximately the same distance from the common plane.

15. A method of fabricating a radiation detector structure, comprising the steps of:

providing a substrate;

growing a first region comprised of Group II-VI semiconductor material upon a first surface of the substrate, the first region being doped to provide a first type of electrical conductivity and having a bandgap selected for absorbing radiation within a first spectral band;

growing a second region upon the first region, the second region being comprised of Group II-VI semiconductor material that is doped to provide a second type of electrical conductivity that is opposite the first type of electrical conductivity;

growing a third region upon the second region, the third region being comprised of Group II-VI semiconductor material that is doped to provide the second type of electrical conductivity, the third region having a bandgap selected for absorbing radiation within a second spectral band;

growing a fourth region upon the third region, the fourth region being comprised of Group II-VI semiconductor material that is doped to provide the first type of electrical conductivity;

differentiating the grown regions into a plurality of mesa structures each containing a portion of each of the plurality of regions; and forming an electrical contact upon a top surface of each of the mesa structures for electrically contacting the first, the third, and the fourth regions.

16. A method as set forth in claim 15, wherein the steps of growing a first, second, third and fourth regions are all accomplished by Liquid Phase Epitaxy.

17. A method as set forth in claim 15, and further comprising a step of:

forming a trench that surrounds the unit cell, the trench being formed to extend through the plurality of layers and into the first surface of the substrate.

18. A method as set forth in claim 15, and further comprising a step of:

providing a lens means that is disposed within, upon, or adjacent to a radiation receiving second surface of the substrate.

19. A method as set forth in claim 15, wherein the first and second spectral bands are selected from the group consisting essentially of SWIR, MWIR, LWIR, and VLWIR, wherein the Group II-VI semiconductor material of each of the regions is comprised of $Hg_{(1-x)}Cd_xTe$, and wherein x is varied during the steps of growing so as to provide a decreasing bandgap energy within the first region, to provide an increasing bandgap energy within the second region, to provide a decreasing bandgap energy with the third region, and to provide an increasing bandgap energy within the fourth region.

20. A method as set forth in claim 15, wherein the first region is n-type, wherein the second region is $p^+$-type, wherein the third region is p-type, and wherein the fourth region is $n^+$-type.

* * * * *